(12) United States Patent
Cull et al.

(10) Patent No.: US 11,899,468 B2
(45) Date of Patent: Feb. 13, 2024

(54) SENSOR FOR FLASHING LIGHT DETECTION

(71) Applicant: Waymo LLC, Mountain View, CA (US)

(72) Inventors: Evan Cull, Sunnyvale, CA (US); Nirav Dharia, San Jose, CA (US)

(73) Assignee: Waymo LLC, Mountain View, CA (US)

( * ) Notice: Subject to any disclaimer, the term of this patent is extended or adjusted under 35 U.S.C. 154(b) by 146 days.

(21) Appl. No.: 17/131,302

(22) Filed: Dec. 22, 2020

(65) Prior Publication Data

US 2022/0197300 A1  Jun. 23, 2022

(51) Int. Cl.
*G05D 1/02* (2020.01)
*B60W 30/095* (2012.01)
*H01L 31/02* (2006.01)

(52) U.S. Cl.
CPC ......... *G05D 1/0246* (2013.01); *B60W 30/095* (2013.01); *H01L 31/02024* (2013.01); *B60W 2420/403* (2013.01)

(58) Field of Classification Search
CPC .............. G05D 1/0246; B60W 30/095; B60W 2420/403; H01L 31/02024
USPC ........................................................ 701/23
See application file for complete search history.

(56) References Cited

U.S. PATENT DOCUMENTS

| | | | | |
|---|---|---|---|---|
| 4,683,990 A | * | 8/1987 | Wright | B66B 1/3492 187/394 |
| 5,187,373 A | * | 2/1993 | Gregori | G08G 1/087 340/906 |
| 5,187,476 A | * | 2/1993 | Hamer | G08G 1/087 340/904 |
| 6,222,457 B1 | * | 4/2001 | Mills | B60D 1/36 340/687 |

(Continued)

FOREIGN PATENT DOCUMENTS

| CN | 101233550 A | * | 7/2008 | ............... G08G 1/07 |
|---|---|---|---|---|
| CN | 101496076 A | * | 7/2009 | ............. G08G 1/087 |

(Continued)

OTHER PUBLICATIONS

Yurtsever, et al., "A Survey of Autonomous Driving: Common Practices and Emerging Technologies," Apr. 2, 2020.
"3D Cameras in Autonomous Vehicles," Aug. 1, 2020.

*Primary Examiner* — Richard A Goldman
(74) *Attorney, Agent, or Firm* — McDonnell Boehnen Hulbert & Berghoff LLP (57) ABSTRACT

A system includes an array of photodiode sensors positioned on an autonomous vehicle. Each photodiode sensor in the array of photodiode sensors is oriented in a different direction and configured to generate electrical current signals in response to detecting a flashing light in a surrounding environment of the autonomous vehicle. The system also includes a processor coupled to the array of photodiode sensors. The processor is configured to determine a location of a source of the flashing light relative to the autonomous (Continued)

vehicle based on electrical current signals from at least one photodiode sensor in the array of photodiode sensors. The processor is also configured to generate a command to maneuver the autonomous vehicle based on the location of the source relative to the autonomous vehicle.

21 Claims, 8 Drawing Sheets

(56) References Cited

U.S. PATENT DOCUMENTS

| | | | |
|---|---|---|---|
| 6,433,856 B1* | 8/2002 | Yoo | G01S 17/003 356/3.01 |
| 7,199,883 B1* | 4/2007 | Schaad | B60L 13/10 108/169 |
| 8,054,200 B1* | 11/2011 | Nelson | G08G 1/0965 340/901 |
| 9,249,742 B2* | 2/2016 | Sangameswaran | F02D 29/02 |
| 9,278,689 B1* | 3/2016 | Delp | G10L 25/48 |
| 9,558,659 B1* | 1/2017 | Silver | G08G 1/096783 |
| 9,671,489 B1* | 6/2017 | Aina | G01S 3/782 |
| 9,881,349 B1 | 1/2018 | Roth et al. | |
| 9,889,859 B2 | 2/2018 | Tatourian et al. | |
| 10,286,757 B2* | 5/2019 | Sorokin | B60Q 1/549 |
| 10,449,815 B2* | 10/2019 | Kulkarni | B60Q 1/305 |
| 10,453,208 B2 | 10/2019 | Wendel et al. | |
| 10,611,389 B2 | 4/2020 | Khosia | |
| 10,706,308 B2 | 7/2020 | Zaman et al. | |
| 10,798,319 B2* | 10/2020 | Breuer | G06V 20/584 |
| 10,816,635 B1* | 10/2020 | Newman | G07C 5/008 |
| 10,896,606 B1* | 1/2021 | Hayes | G05D 1/0022 |
| 11,364,910 B1* | 6/2022 | Schmitt | G01S 3/8083 |
| 11,440,462 B1* | 9/2022 | Salter | B60Q 1/30 |
| 2002/0154217 A1* | 10/2002 | Ikeda | G08G 1/167 348/148 |
| 2011/0133907 A1* | 6/2011 | Stiles | B60Q 1/305 340/13.24 |
| 2012/0038490 A1* | 2/2012 | Verfuerth | G08G 1/04 340/917 |
| 2013/0088600 A1* | 4/2013 | Wu | H04N 7/18 348/149 |
| 2014/0293265 A1* | 10/2014 | Stettner | G01S 17/06 356/4.01 |
| 2015/0076355 A1* | 3/2015 | Grauer | H04N 25/621 250/208.1 |
| 2016/0012472 A1* | 1/2016 | Nagaswami | G06Q 30/0265 705/14.62 |
| 2016/0252905 A1* | 9/2016 | Tian | G06V 20/584 701/23 |
| 2016/0363649 A1* | 12/2016 | Korevaar | G01S 5/16 |
| 2017/0053534 A1* | 2/2017 | Lokesh | B60W 30/165 |
| 2017/0249839 A1* | 8/2017 | Becker | G08G 1/096725 |
| 2017/0270376 A1* | 9/2017 | Aina | G01S 7/4816 |
| 2018/0096595 A1* | 4/2018 | Janzen | G06V 10/94 |
| 2018/0125357 A1* | 5/2018 | Suzuki | G06V 10/761 |
| 2018/0208188 A1* | 7/2018 | Williams | G08G 1/162 |
| 2018/0220189 A1* | 8/2018 | Hodge | H04N 21/2347 |
| 2018/0233047 A1* | 8/2018 | Mandeville-Clarke | G08G 1/166 |
| 2018/0284285 A1* | 10/2018 | Curatu | G01S 17/10 |
| 2018/0338229 A1* | 11/2018 | Nemec | G06Q 50/30 |
| 2018/0341018 A1* | 11/2018 | Qin | G01S 5/10 |
| 2019/0096032 A1 | 3/2019 | Li | |
| 2019/0128994 A1* | 5/2019 | Kozdras | H04W 84/12 |
| 2019/0135300 A1 | 5/2019 | Sharma et al. | |
| 2019/0248326 A1* | 8/2019 | McIntosh | G05D 1/0022 |
| 2020/0059598 A1* | 2/2020 | Breuer | H04N 23/951 |
| 2020/0059613 A1* | 2/2020 | Dreier | H04N 7/183 |
| 2020/0073385 A1 | 3/2020 | Rubin et al. | |
| 2020/0097740 A1 | 3/2020 | Hirano et al. | |
| 2020/0120299 A1 | 4/2020 | Li et al. | |
| 2020/0160069 A1 | 5/2020 | Sathyanarayana et al. | |
| 2020/0182982 A1 | 6/2020 | Shen et al. | |
| 2020/0200855 A1* | 6/2020 | Newman | G08G 1/163 |
| 2020/0256999 A1 | 8/2020 | Demirtas et al. | |
| 2020/0257299 A1* | 8/2020 | Wang | G08G 1/167 |
| 2020/0257306 A1* | 8/2020 | Nisenzon | G06V 20/56 |
| 2020/0349345 A1* | 11/2020 | Hodge | G06Q 30/08 |
| 2020/0403457 A1* | 12/2020 | Nydell | H04B 10/616 |
| 2021/0026019 A1* | 1/2021 | Gahagan | G01S 17/88 |
| 2021/0183245 A1* | 6/2021 | Ramirez | G08G 1/0965 |
| 2021/0199479 A1* | 7/2021 | Lau | B60R 1/00 |
| 2021/0201049 A1* | 7/2021 | Su | G06F 18/2411 |
| 2022/0024484 A1* | 1/2022 | Armstrong-Crews | B60W 40/02 |
| 2022/0060822 A1* | 2/2022 | Chng | B60W 60/0027 |
| 2022/0197300 A1* | 6/2022 | Cull | G06V 20/584 |
| 2022/0210584 A1* | 6/2022 | Freund | G06F 3/165 |
| 2022/0237996 A1* | 7/2022 | Hodge | G08B 13/19647 |
| 2022/0291323 A1* | 9/2022 | Newman | G08G 1/017 |

FOREIGN PATENT DOCUMENTS

| | | | | |
|---|---|---|---|---|
| CN | 109624833 A | | 4/2019 | |
| CN | 106248083 B | * | 6/2019 | G01C 21/20 |
| CN | 106325276 B | * | 6/2019 | B25J 11/0085 |
| CN | 209803992 U | * | 12/2019 | |
| CN | 210667169 U | | 6/2020 | |
| CN | 107992788 B | * | 9/2020 | G06K 9/00825 |
| CN | 110415542 B | * | 7/2021 | G08G 1/09623 |
| CN | 113421438 A | * | 9/2021 | |
| CN | 114663639 A | * | 6/2022 | B60W 30/095 |
| DE | 102013004271 A1 | * | 9/2013 | B60W 50/14 |
| DE | 102019004709 A1 | | 1/2020 | |
| WO | 2020115015 A1 | | 6/2020 | |
| WO | WO-2021173198 A1 | * | 9/2021 | B60W 30/09 |
| WO | WO-2021173199 A1 | * | 9/2021 | B60W 30/09 |

* cited by examiner

SENSOR FOR FLASHING LIGHT DETECTION

BACKGROUND

Autonomous vehicles or vehicles operating in an autonomous mode may be equipped with one or more sensors configured to detect information about an environment in which the vehicle operates. As a non-limiting example, high-resolution cameras may be used to capture high-resolution images of the environment surrounding an autonomous vehicle. The high-resolution images may be processed to identify objects and conditions external to the autonomous vehicle, and operation of the autonomous vehicle can be adjusted based on the identified objects and conditions depicted in the high-resolution images. For example, a command may be generated to stop the autonomous vehicle if the high-resolution images depict a stop sign.

Typically, a substantial amount of processing power is used to process the high-resolution images generated by high-resolution cameras. Additionally, there is a trade-off between resolution of images generated by a camera and a frequency at which the camera can generate images. For example, a high-resolution camera that generates high-resolution images typically generates images at relatively low frequencies. As a result, the high-resolution images captured by the high-resolution camera may not be able to operate at a frequency that is high enough to detect particular external lighting conditions, such as a flashing or flickering light.

SUMMARY

The present disclosure generally relates to using low-resolution and high-frequency optical sensors positioned on a roof of an autonomous vehicle to localize a source of a flashing or flickering light, such as a flashing light of an emergency vehicle. In example implementations, a wide-angle lens, such as a Fresnel lens, is coupled to an array of photodiode sensors on the roof of the autonomous vehicle. If a particular photodiode sensor detects a light flicker, such as a flashing light, the particular photodiode sensor generates an electrical current signal having a magnitude that is proportional to magnitude of light flicker detected by the particular photodiode sensor. A circuit, such as a trans-impedance amplifier circuit, can be coupled to, or included in, a computing system to receive the electrical current signal and convert the electrical current signal to an output voltage. To isolate flashing lights (or flickers) from direct-current (DC) light, DC light levels can be filtered using analog filters, software calibration, alternating-current (AC) coupling, etc.

The computing system can determine a location of a source of the light flicker based on an orientation of the particular photodiode sensor. For example, if the particular photodiode sensor is oriented in a first direction and other photodiode sensors in the array of photodiode sensors are oriented in other directions, the computing system can determine that the source of the light flicker is proximate to the first direction if the particular photodiode sensor is the only photodiode sensor in the array of photodiode sensors to detect the light flicker and generate corresponding electrical current signals. The computing system can also determine the location of the source based on the magnitude of electrical current signals generated from each photodiode sensor. For example, the source may be more proximate to an orientation of a photodiode sensor generating higher magnitude electrical current signals based on the light flicker than to an orientation of a photodiode sensor generating lower magnitude electrical current signals based on the light flicker.

In example additional or accompanying implementations, camera image sensors coupled to a roof of the autonomous vehicle can be reconfigured to capture low-resolution images at a relatively high frequency. For example, the camera image sensors can capture low-pixel images at a frequency that is at least twice as fast as the light flicker. The computing system can localize the source of the light flicker by identifying windows in the low-resolution images that depicts the light flicker.

It should be understood that the techniques described herein can be implemented using various types of optical sensors. For example, the techniques described herein can be implemented using arrays of photodiode sensors, high-frequency low-resolution optical sensors or cameras, or a combination thereof. As described below, timestamps from microphones oriented in different directions can also be used to localize a source of the light flicker if the source generates audio, such as an accompanying siren.

In a first aspect, a system includes an array of photodiode sensors positioned on an autonomous vehicle. Each photodiode sensor in the array of photodiode sensors is oriented in a different direction and configured to generate electrical current signals in response to detecting a flashing light in a surrounding environment of the autonomous vehicle. The system also includes a processor coupled to the array of photodiode sensors. The processor is configured to determine a location of a source of the flashing light relative to the autonomous vehicle based on electrical current signals from at least one photodiode sensor in the array of photodiode sensors. The processor is also configured to generate a command to maneuver the autonomous vehicle based on the location of the source relative to the autonomous vehicle.

In a second aspect, a method includes receiving, at a processor, electrical current signals from at least one photodiode sensor of an array of photodiode sensors positioned on an autonomous vehicle. Each photodiode sensor in the array of photodiode sensors is oriented in a different direction, and the electrical current signals from the at least one photodiode sensor is generated in response to detecting a flashing light in a surrounding environment of the autonomous vehicle. The method also includes determining a location of a source of the flashing light relative to the autonomous vehicle based on the electrical current signals from the at least one photodiode sensor. The method further includes generating a command to maneuver the autonomous vehicle based on the location of the source relative to the autonomous vehicle.

In a third aspect, a non-transitory computer-readable medium has stored instructions that are executable by a computing device to cause the computing device to perform functions. The functions include receiving, at a processor, electrical current signals from at least one photodiode sensor of an array of photodiode sensors positioned on an autonomous vehicle. Each photodiode sensor in the array of photodiode sensors is oriented in a different direction, and the electrical current signals from the at least one photodiode sensor is generated in response to detecting a flashing light in a surrounding environment of the autonomous vehicle. The functions also include determining a location of a source of the flashing light relative to the autonomous vehicle based on the electrical current signals from the at least one photodiode sensor. The functions further include generating a command to maneuver the autonomous vehicle based on the location of the source relative to the autonomous vehicle.

Other aspects, embodiments, and implementations will become apparent to those of ordinary skill in the art by reading the following detailed description, with reference where appropriate to the accompanying drawings.

DETAILED DESCRIPTION

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

The present disclosure generally relates to using optical sensors mounted on an autonomous vehicle (e.g., positioned on a roof of an autonomous vehicle) to localize a source of flashing lights. For example, an array of photodiode sensors can be coupled to the roof of the autonomous vehicle to detect flickers associated with flashing lights in an environment surrounding the autonomous vehicle. In response to detecting flickers of light, a corresponding photodiode sensor can generate an electrical signal (e.g., a current signal or voltage signal) that is provided to a processor (e.g., a computing device of the autonomous vehicle). The electrical signal can be a waveform having an amplitude, a frequency, a cycle time, etc. Based on the frequency or cycle time of the waveform, the processor can determine a frequency of the flicker. The frequency of the flicker can be used by the processor to classify a source of the flashing lights. As a non-limiting example, if the frequency of the flicker is between 10 Hertz (Hz) and 20 Hz, the processor may classify the source as an emergency vehicle, such as an ambulance or a fire truck. If each photodiode sensor in the array of photodiode sensors is oriented in a different direction, the processor can localize the source of the flashing lights based on the amplitude of each electrical signal (e.g., waveform) received from the photodiode sensors. For example, photodiode sensors oriented in a direction of the source may generate electrical signals with a larger amplitude than photodiode sensors oriented in a direction opposite the source.

Upon localizing the source using electrical signals from the array of photodiode sensors, the processor can reconfigure a camera image sensor to capture high-frequency low-resolution images of an area proximate to the source to further localize the source. For example, the processor can generate and send a reconfiguration command to the camera image sensor that reconfigures the camera image sensor to capture images at a rate that is at least twice the frequency of the determined flicker. By reconfiguring the camera image sensor to capture low-resolution images at an elevated rate, the processor can better enable the camera image sensor to detect the flickers of the flashing light. Upon capturing the low-resolution images, the camera image sensor transmits the low-resolution images to the processor for further localization. For example, the processor can identify and read out windows (e.g., groups of pixels) in the low-resolution images that depict the flickers of flashing light. Based on the identified windows, the processor can further localize the source of the flashing light.

In response to determining the location of the source, such as an emergency vehicle, the processor can generate commands to maneuver the autonomous vehicle. As non-limiting examples, the processor can generate a command to steer the autonomous vehicle to the right side of the road, a command to reduce the speed of the autonomous vehicle, etc.

Thus, the optical sensors coupled to the roof of the autonomous vehicle can be used to localize the flashing lights and determine a location of the source relative to the autonomous vehicle. Moreover, the optical sensors can be used to determine the location of the source in scenarios where the source is not detected by audio sensors (e.g., microphones).

II. Example Embodiments

Figure 2A:
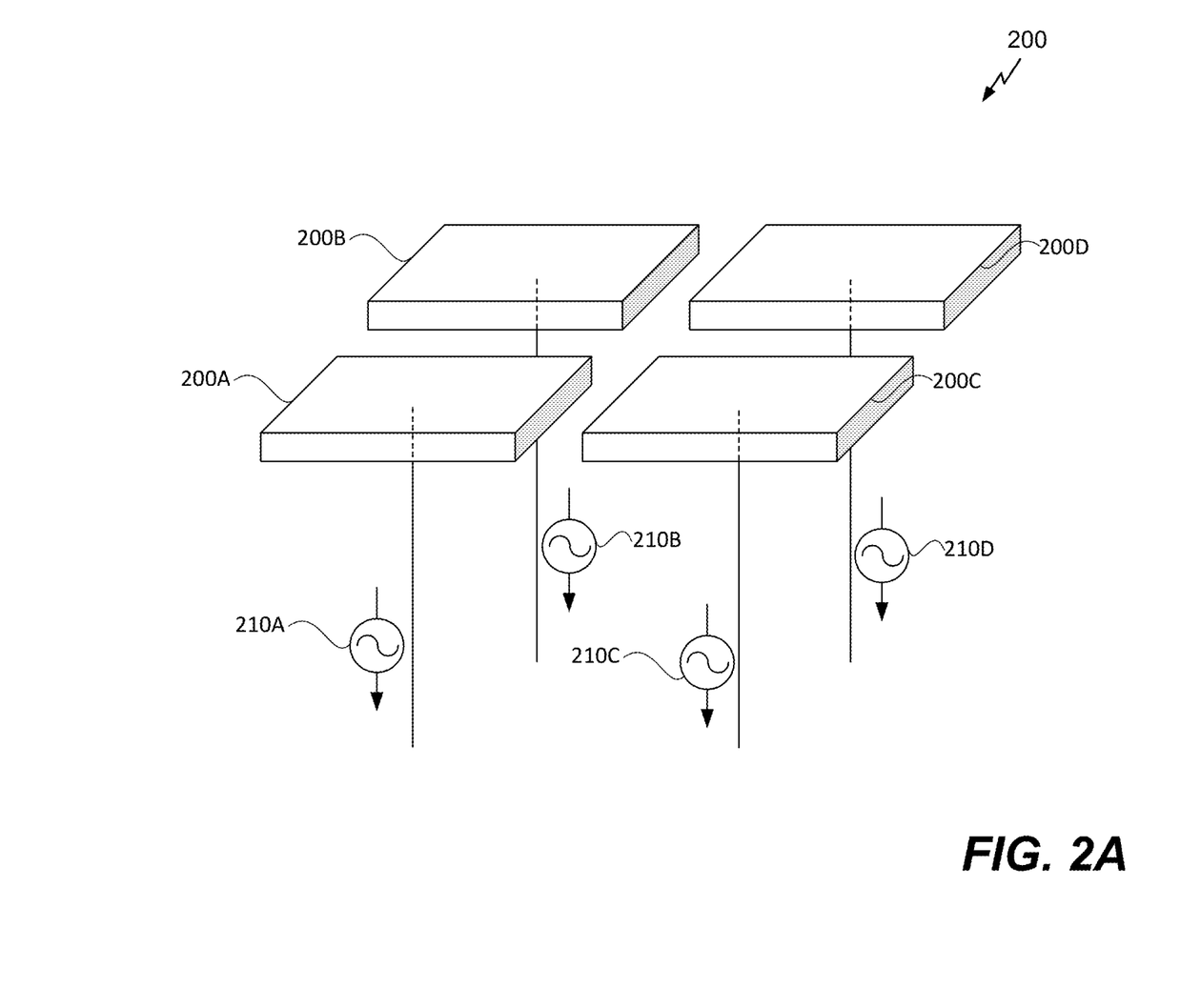
FIG. 2A is an illustrative diagram of an array of photodiode sensors, in accordance with an example embodiment.

Particular implementations are described herein with reference to the drawings. In the description, common features are designated by common reference numbers throughout the drawings. In some drawings, multiple instances of a particular type of feature are used. Although these features are physically and/or logically distinct, the same reference number is used for each, and the different instances are distinguished by addition of a letter to the reference number. When the features as a group or a type are referred to herein (e.g., when no particular one of the features is being referenced), the reference number is used without a distinguishing letter. However, when one particular feature of multiple features of the same type is referred to herein, the reference number is used with the distinguishing letter. For example, referring to FIG. 2, the multiple photodiode sensors are illustrated and associated with reference numbers 200A, 200B, 200C, etc. When referring to a particular one of the photodiode sensors, such as the photodiode sensor 200A, the distinguishing letter "A" is used. However, when referring to any arbitrary one of these photodiode sensors or to these photodiode sensors as a group, the reference number 200 is used without a distinguishing letter.

Figure 1:
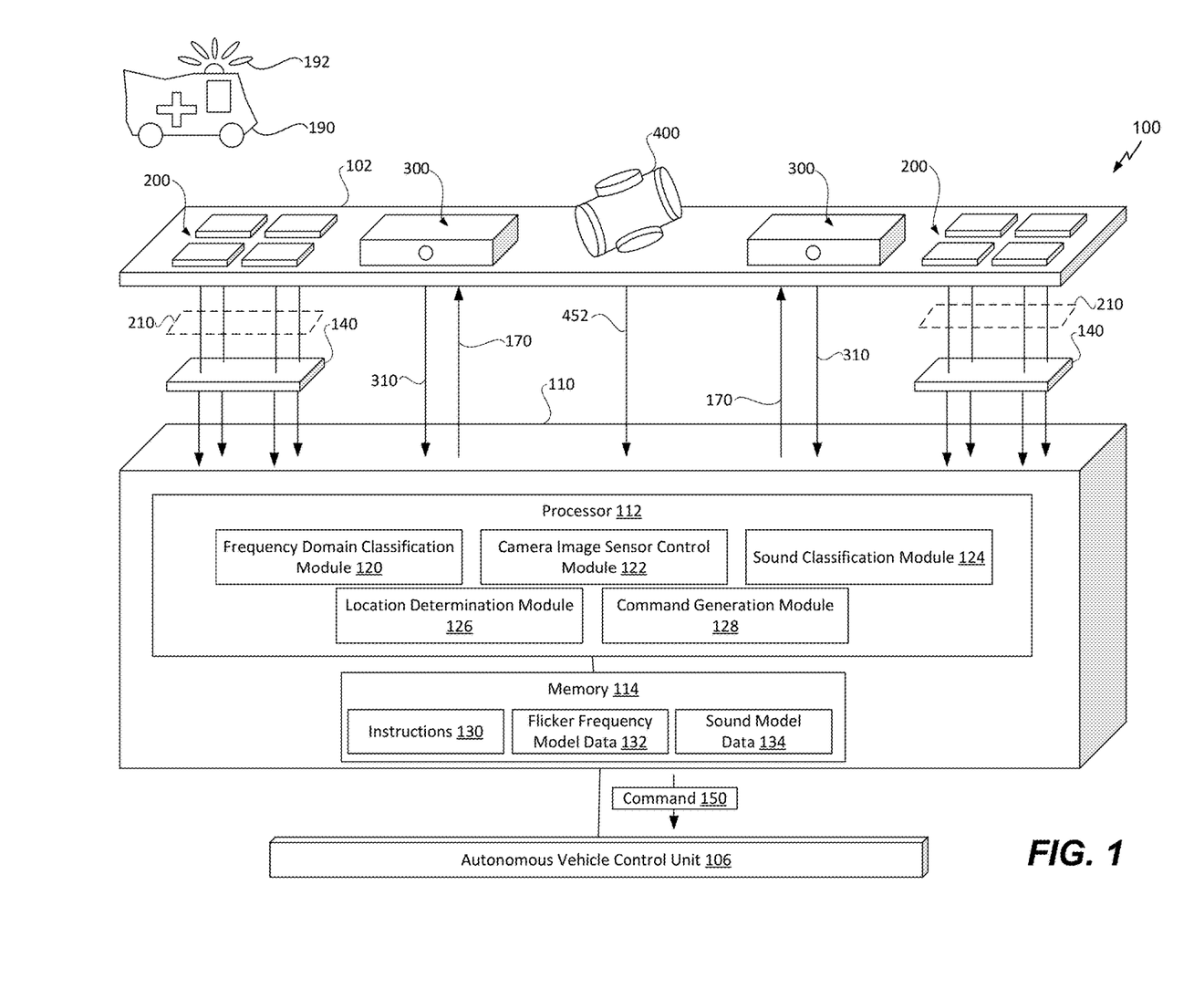
FIG. 1 is a functional diagram illustrating components of an autonomous vehicle, in accordance with an example embodiment.

FIG. 1 is a functional diagram illustrating components of an autonomous vehicle 100, in accordance with an example embodiment. The autonomous vehicle 100 may take the form of a car, truck, motorcycle, bus, boat, airplane, helicopter, lawn mower, earth mover, snowmobile, aircraft, recreational vehicle, amusement park vehicle, farm equipment, construction equipment, tram, golf cart, train, and trolley, for example. Other vehicles are possible as well. The autonomous vehicle 100 may be configured to operate fully or partially in an autonomous mode. For example, the autonomous vehicle 100 may control itself while in the autonomous mode, and may be operable to determine a current state of the autonomous vehicle 100 and its environment, determine a predicted behavior of at least one other vehicle in the environment, determine a confidence level that may correspond to a likelihood of the at least one other vehicle to perform the predicted behavior, and control the autonomous vehicle 100 based on the determined information. While in the autonomous mode, the autonomous vehicle 100 may be configured to operate without human interaction.

In FIG. 1, a roof 102 of the autonomous vehicle 100 is shown. Different sensors are coupled to the roof 102 of the autonomous vehicle 100 to detect flicker associated with flashing lights 192 or to detect audio associated with a source 190 of the flashing lights 192. For example, two arrays of photodiode sensors 200 are coupled to the roof 102 to detect flicker associated with flashing lights 192 in an environment surrounding the autonomous vehicle 100, two camera image sensors 300 are coupled to the roof 102 to detect flicker associated with flashing lights 192 in the environment surrounding the autonomous vehicle 100, and a microphone unit 400 is coupled to the roof 102 to detect audio associated with the source 190 of the flashing lights 192. As a non-limiting example, if the flashing lights 192 are associated with an emergency vehicle 190, the microphone unit 400 can detect a siren sound generated by a siren of the emergency vehicle 190.

It should be understood that the number of sensors and the types of sensors coupled to the roof 102 are merely for illustrative purposes and should not be construed as limiting. For example, in other implementations, additional (or fewer) arrays of photodiode sensors 200 can be coupled to roof 102, additional (or fewer) camera image sensors 300 can be coupled to the roof 102, and additional (or fewer) microphone units 400 can be coupled to the roof 102. Additionally, in some implementations, the techniques described herein can be implemented using a subset of sensors. As a non-limiting example, the techniques described herein can be implemented using the array of photodiode sensors 200 without the use of the camera image sensors 300 or the microphone unit 400. As another non-limiting example, the techniques described herein can be implemented using the camera image sensors 300 without the use of the array of photodiode sensors 200 or the microphone unit 400. As described with respect to FIGS. 2A-4, each sensor can detect information that is used by a computing system 110 of the autonomous vehicle 100 to localize the source 190 of the flashing lights 192 and to classify the source 190 of the flashing lights 192.

FIG. 2A is an illustrative diagram of the array of photodiode sensors 200, in accordance with an example embodiment. The array of photodiode sensors 200 can be coupled to the autonomous vehicle 100 to detect light flicker associated with the flashing lights 192, as illustrated in FIG. 1. In a particular implementation, the array of photodiode sensors 200 (or multiple arrays of photodiodes sensors 200 as illustrated in FIG. 1) is coupled to the roof 102 of the autonomous vehicle 100. However, in other implementations, the array of photodiode sensors 200 can be coupled to other components of the autonomous vehicle 100, such as the trunk or the front hood.

The array of photodiode sensors 200 includes a photodiode sensor 200A, a photodiode sensor 200B, a photodiode sensor 200C, and a photodiode sensor 200D. Although four photodiode sensors 200A-200D are illustrated in FIG. 2 as a quad-cell photodiode package, in other implementations, the array of photodiode sensors 200 can include additional (or fewer) photodiode sensors 200. For example, the array of photodiode sensors 200 can include N photodiode sensors, where N is any integer value greater than one (1). Thus, if N is equal to eight (8), the array of photodiode sensors 200 can include eight (8) photodiode sensors 200. Alternatively, if N is equal to three (3), the array of photodiode sensors 200 can three (3) photodiode sensors 200.

Each photodiode sensor 200A-200D is configured to generate corresponding electrical current signals 210A-210D in response to detecting light flicker associated with the flashing lights 192. To illustrate, the photodiode sensor 200A generates electrical current signals 210A in response to detecting light flicker associated with the flashing lights 192, the photodiode sensor 200B generates electrical current signals 210B in response to detecting light flicker associated with the flashing lights 192, the photodiode sensor 200C generates electrical current signals 210C in response to detecting light flicker associated with the flashing lights 192, and the photodiode sensor 200D generates electrical current signals 210D in response to detecting light flicker associated with the flashing lights 192. Thus, the photodiode sensors 200A-200B convert detected light 192 into electrical current 210A-210D, respectively.

Each photodiode sensor 200A-200D can have a different orientation to enable the array of photodiode sensors 200 to detect light flicker associated with the flashing lights 192 from a relatively large area. As described below, by orienting each photodiode sensor 200A-200D in a different direction, the source 190 of the flashing lights 192 can be localized based on which photodiode sensor 200A-200D generates electrical current signals 210. For example, if the photodiode sensor 200A generates the electrical current signals 210A (based on detecting light flicker associated with the flashing lights 192) and the other photodiode sensors 200B-200D fail to generate electrical current signals 210B-210D, the computing device 110 can determine that the source 190 of the flashing lights 192 is proximate to the orientation of the photodiode sensor 200A. Alternatively, if two photodiode sensors 200A, 200B generate electrical current signals 210A, 210B, the computing device 110 can determine that the source 190 of the flashing lights 192 is more proximate to the photodiode sensor 200 that generates the highest amount of electrical current 210.

Characteristics or properties of the electrical current signals 210A-210D can be used by the computing system 110 to determine a flicker frequency of the flashing lights 192 detected by a respective photodiode sensor 200A-200D. For example, the electrical current signals 210A-210D generated by the photodiode sensors 200A-200D can be alternating current (AC) waveforms. The flicker frequency of the flashing lights 192 can be determined based on a cycle time of the AC waveforms. That is, the flicker frequency of the flashing lights 192 can be determined based on an amount of time between peak values of the electrical current signal 210. To illustrate, once light 192 is detected by the photodiode sensor 200A (e.g., when a light flicker occurs), the magnitude of the electrical current signal 210A generated by the photodiode sensor 200A will be relatively high (e.g., proximate to a peak value). When light 192 is not detected by the photodiode sensor 200A, the magnitude of the electrical current signal 210A generated by the photodiode sensor 200A will be relatively low (e.g., proximate to zero). Thus, the flicker frequency of the flashing lights 192 is correlated to the amount of time between peak values of the electrical current signal 210A.

Figure 2B:
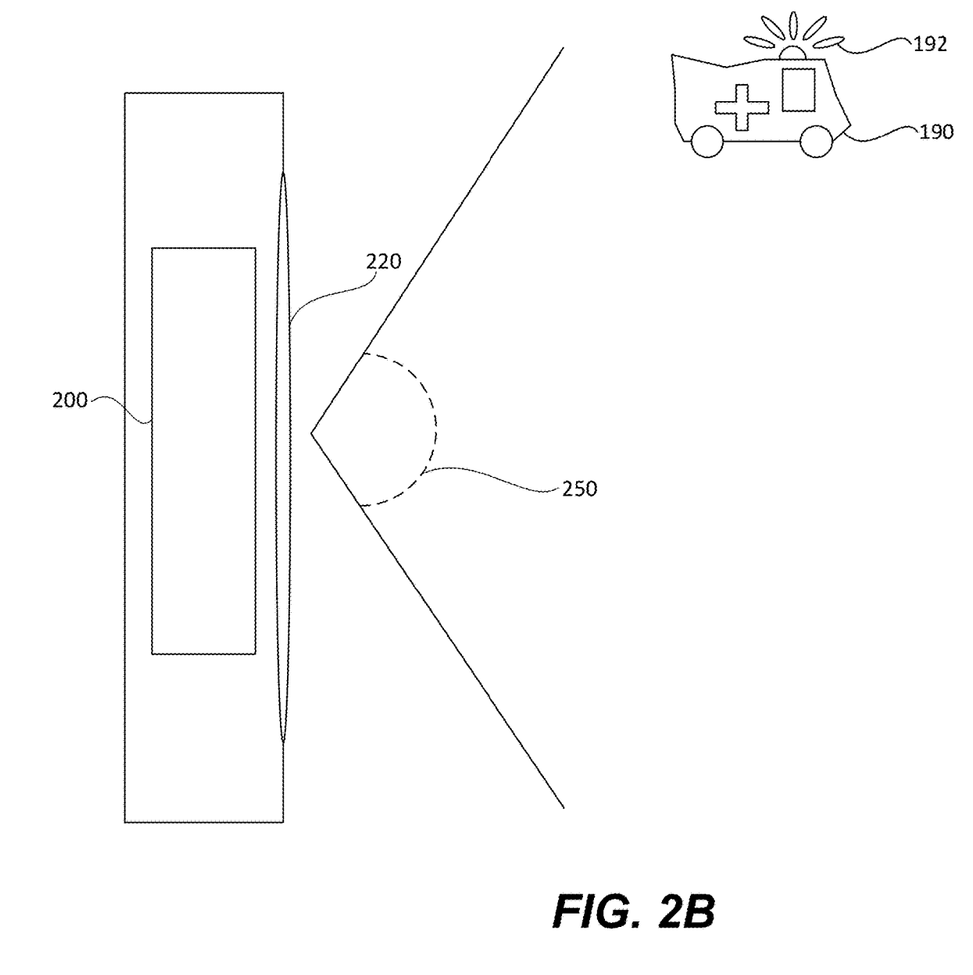
FIG. 2B is another illustrative diagram of the array of photodiode sensors, in accordance with an example embodiment.

FIG. 2B is another illustrative diagram of the array of photodiode sensors 200, in accordance with an example embodiment. In FIG. 2B, a lens 220, such as a Fresnel lens, is coupled to the array of photodiodes 200 to extend a field of view 250 of the array of photodiodes 200. As such, the array of photodiodes 200 can detect light flicker associated with the flashing lights 192 across a relatively large viewing area. Thus, by using the lens 220, the field of view 250 of the array of photodiodes 200 can be extended and, as a result, fewer arrays of photodiodes 200 can be used to detect the light flicker associated with the flashing lights 192. The use of fewer arrays of photodiodes 200 can reduce cost and processing complexity.

Referring back to FIG. 1, the electrical current signals 210 can be provided to an analog-to-digital converter (ADC) 140 to digitize the electrical current signals 210 generated by the array of photodiode sensors 200. The digitized versions of the electrical current signals 210 are provided to the computing system 110. In some implementations, the ADC 140 is integrated into the array of photodiodes 200 or into the computing system 110. In some implementations, a circuit, such as a trans-impedance amplifier circuit, can be coupled to, or included in, the array of photodiodes 200 to receive the electrical current signals 210 and convert the electrical current signals 210 to an output voltage. To isolate light flicker associated with the flashing lights 192 from direct-current (DC) light, DC light levels can be filtered using analog filters, software calibration, alternating-current (AC) coupling, etc.

The computing system 110 includes a processor 112 that is coupled to a memory 114. The memory 114 can be a non-transitory computer-readable medium that stores instructions 130 that are executable by the processor 112. The processor 112 includes a frequency domain classification module 120, a camera image sensor control module 122, a sound classification module 124, a location determination module 126, and a command generation module 128. According to some implementations, one or more of the modules 120, 122, 124, 126, 128 can correspond to software (e.g., instructions 130) executable by the processor 112. According to other implementations, one or more the modules 120, 122, 124, 126, 128 can correspond to dedicated circuitry (e.g., application-specific integrated circuits (ASICs) or field programmable gate arrays (FPGAs)) integrated into the processor 112.

The frequency domain classification module 120 is configured to determine, based at least on characteristics of the electrical current signals 210 from the array of photodiode sensors 200, a flicker frequency of the flashing lights 192. For example, as described above, the electrical current signals 210A-210D generated by the photodiode sensors 200A-200D can be AC waveforms, and the flicker frequency of the flashing lights 192 can be determined based on a cycle time of the AC waveforms. Upon determining the flicker frequency of the flashing lights 192, the frequency domain classification module 120 can access flicker frequency model data 132 in the memory 114 to classify the source 190 of the flashing lights 192. The flicker frequency model data 132 indicates flicker frequencies for different sources. As a non-limiting example, the flicker frequency model data 132 can indicate that emergency vehicles have a flicker frequency between 10 Hertz (Hz) and 20 Hz. Thus, if the frequency of the electrical current signal 210 is between 10 Hz and 20 Hz, the frequency domain classification module 120 can classify the source 190 of the flashing lights 192 as an emergency vehicle.

The flicker frequency model data 132 can be updated at various times by a remote transfer of flicker frequency model data 132. Additionally, the flicker frequency model data 132 can indicate frequency patterns for different sources. For example, the flicker frequency model data 132 can indicate, in certain regions of the world, that the flicker frequency of some emergency vehicles are non-constant. To illustrate, an emergency vehicle can have a quick flicker of 25 Hz followed by a slow flicker of 10 Hz. Updating the flicker frequency model data 132 can better equip the frequency domain classification module 120 to classify the source 190 of the flashing lights 192.

The location determination module 126 is configured to determine a location of the source 190 of the flashing lights 192 relative to the autonomous vehicle 100 based on the electrical current signals 210. For example, assume the photodiode sensor 200A is oriented in a first direction, the photodiode sensor 200B is oriented in a second direction, the photodiode sensor 200C is oriented in a third direction, and the photodiode sensor 200D is oriented in a fourth direction. In response to receiving the electrical current signals 210A-210D, the location determination module 126 can localize the source 190 of the flashing lights 192 based on the magnitude of each electrical current signal 210A-210D.

To illustrate, the location determination module 126 can determine a magnitude of the electrical current signals 210A from the photodiode sensor 200A, a magnitude of the electrical current signals 210B from the photodiode sensor 200B, a magnitude of the electrical current signals 210C from the photodiode sensor 200C, and a magnitude of the electrical current signals 210D from the photodiode sensor 200D. Based on the magnitudes of the electrical current signals 210A-210D, the location determination module 126 can perform a localization operation to localize the source 190 of the flashing lights 192 relative to the autonomous vehicle 100. For example, the localization operation can indicate that the source 190 of the flashing lights 192 is proximate to the first direction in response to a determination that the magnitude of the electrical current signal 210A is greater than the magnitude of the other electrical current signals 210B-210D. Alternatively, the localization operation can indicate that the source 190 of the flashing lights 192 is proximate to the second direction in response to a determination that the magnitude of the electrical current signal 210B is greater than the magnitude of the other electrical current signals 210A, 210C, 210D. Thus, by orienting the photodiode sensors 200 in different directions, source localization can be performed based on the strength of the detected light by each photodiode sensor 200, which is directly proportional to the magnitude of a resulting electrical current signal 210.

In some scenarios, the processor 112 can further localize the source 190 of the flashing lights 192 based on low-resolution images 310 generated by the camera image sensor 300. For example, the processor 112 can determine a general location of the source 190 of the flashing lights 192 based on the electrical current signals 210A-210D from the photodiode sensors 200A-200D. Upon determining the general location, the camera image sensor control module 122 can generate and send a command 170 to one or more camera image sensors 300. Based on the command 170, the camera image sensor 300 can focus on the general location and capture high-frequency low-resolution images 310 of the general location that are used to further localize the source 190 of the flashing lights 192.

Figure 3A:
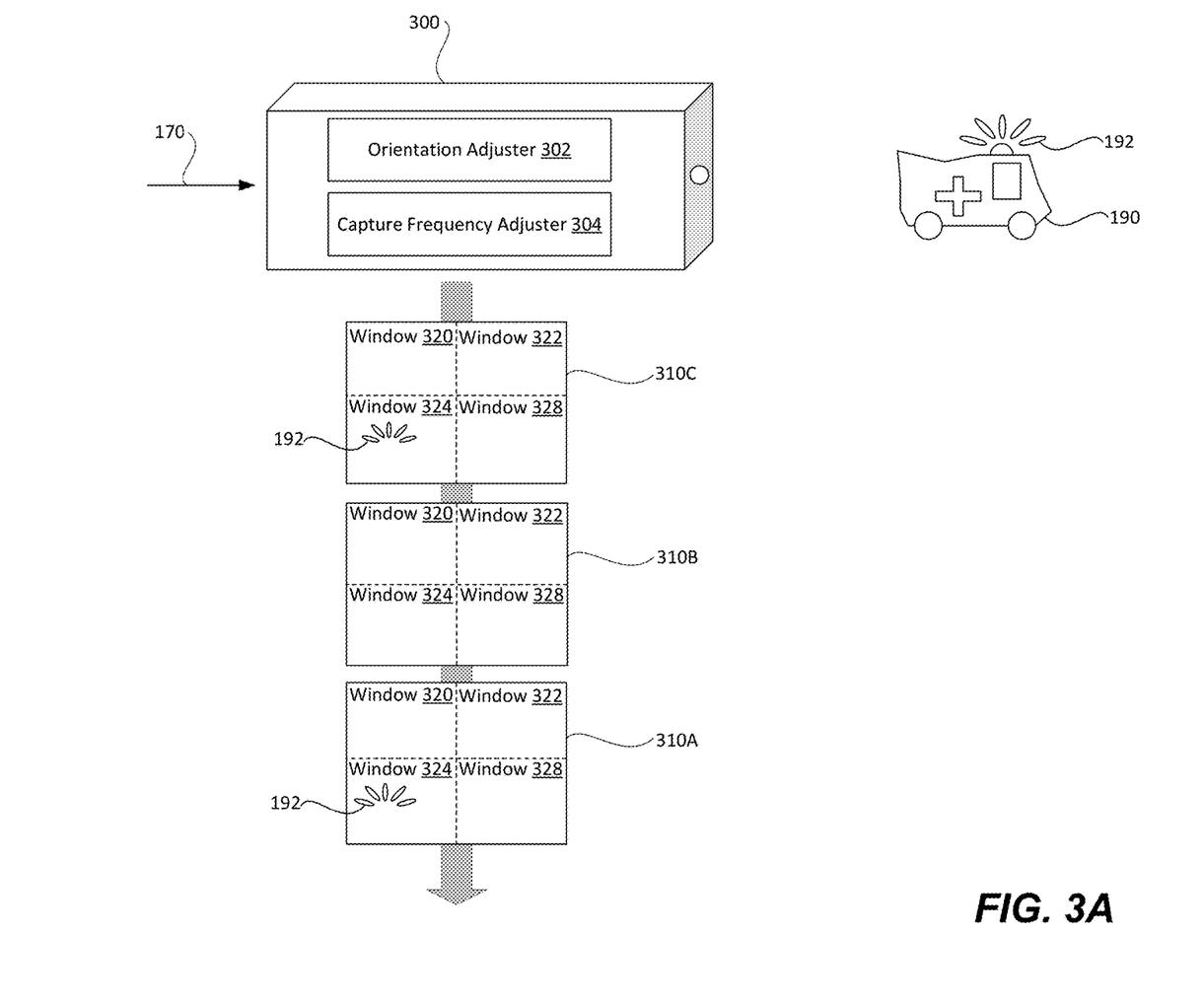
FIG. 3A is an illustrative diagram of a camera image sensor, in accordance with an example embodiment.

FIG. 3A is an illustrative diagram of the camera image sensor 300, in accordance with an example embodiment. The camera image sensor 300 includes an orientation adjuster 302 and a capture frequency adjuster 304. The camera image sensor 300 is configured to capture low-resolution images 310 of the flashing lights 192 at a relatively high frequency (e.g., a frequency that is at least twice the flicker frequency of the flashing lights 192).

In response to receiving the command 170 from the camera image sensor control module 122, the orientation adjuster 302 is configured to adjust an orientation of the camera image sensor 300 to focus on the general location of the source 190 of the flashing lights 192, as determined by the processor 112 based on the electrical current signals 210 from the photodiode sensors 200. For example, the orientation adjuster 302 may adjust an angle of the camera image sensor 300 to focus on the general location of the source 190, a tilt of the camera image sensor 300 to focus on the general location of the source 190, etc. As further explained with respect to FIG. 4, the orientation adjuster 302 can also adjust the orientation of the camera image sensor 300 to focus on the general location of the source 190 of the flashing lights 192, as determined by processor 112 based on audio timestamps of captured audio.

The capture frequency adjuster 304 is configured to adjust a capture frequency of the camera image sensor 300 based on the command 170 from the camera image sensor control module 122. For example, after the frequency domain classification module 120 determines the flicker frequency of the flashing lights 192 based on the cycle time of the electrical current signals 210, the camera image sensor control module 122 may generate the command 170 to indicate a capture frequency for the camera image sensor 300 based on the flicker frequency of the flashing lights 192. In a particular implementation, the capture frequency for the camera image sensor 300 may be at least twice the flicker frequency of the flashing lights 192 to ensure that the low-resolution images 310 captured by the camera image sensor 300 are able to depict flicker patterns of the flashing lights 192.

In some scenarios, there may be an inverse relationship between the capture frequency of the camera image sensor 300 and the quality of the captured images. For example, as the capture frequency of the camera image sensor 300 increases, the quality of the captured images may decrease. Thus, by increasing the capture frequency to at least twice the flicker frequency of the flashing lights 192, the images 310 captured by the camera image sensor 300 may have reduced quality. To illustrate, the images 310 can have a reduced number of pixels and a reduced data size. As a non-limiting example, in response to receiving the command 170, the camera image sensor 300 can generate three (3) megapixel images 310 at a capture frequency of 40 Hz as opposed to generating fifteen (15) megapixel images at a capture frequency of 5 Hz.

Upon reconfiguration to a high-frequency low-resolution mode, the camera image sensor 300 captures the low-resolution images 310A-310C of the flashing lights 192. Although three low-resolution images 310A-310C are illustrated, it should be understood that the camera image sensor 300 captures additional low-resolution images 310 in a relatively short time period. As a non-limiting example, over the span of five (5) seconds, the camera image sensor 300 can capture three-hundred (300) low-resolution images 310 if the capture frequency adjuster 304 adjusts the capture frequency to 40 Hz based on the command 170.

Each low-resolution image 310 can be partitioned (e.g., segmented) to include different windows 320-328. Although four windows 320-328 are depicted in FIG. 3A, it should be understood that a different number of windows can be included in the low-resolution image 310. To reduce processing power, processing complexity, and image file size, each window 320-328 can include a reduced amount of pixels compared to a high-resolution image. The windows 320-328 represent different regions of interest in the field of view of the camera image sensor, as further described with respect to FIG. 3C. As illustrated in FIG. 3A, the window 324 in the low-resolution image 310A depicts the flicker of the flashing lights 192, the flicker of the flashing lights 192 is not depicted in the low-resolution image 310B, and the window 324 in the low-resolution image 310C depicts the flicker of the flashing lights 192.

Referring back to FIG. 1, the camera image sensor 300 is configured to send the low-resolution images 310 to the computing system 110. The location determination module 126 is configured to further localize the source 190 of the flashing lights 192 based on the low-resolution images 310. For example, the location determination module 126 is configured to identify, across a subset of the low-resolution images 310, the window 324 that depicts the flashing lights 192. In the scenario described with respect to FIG. 3A, the location determination module 126 can determine that the flashing lights 192 are depicted in the window 324. Based on the identified window 324, the location determination module 126 can determine the location of the source 190. For example, the location determination module 126 can determine that the source 190 is proximate to a region of interest that corresponds to the window 324 in the low-resolution images 310.

Figure 3B:
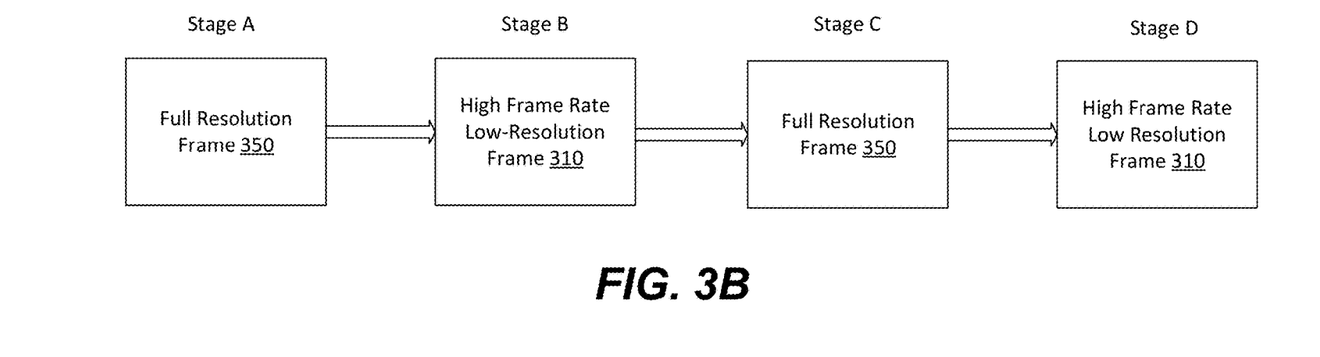
FIG. 3B is a diagram illustrating a sequence of different configurations of the camera image sensor, in accordance with an example embodiment.

FIG. 3B is a diagram illustrating a sequence of different configurations of the camera image sensor 300, in accordance with an example embodiment.

According to FIG. 3B, in Stage A, the camera image sensor 300 generates a full resolution frame 350. To generate the full resolution frame 350, the camera image sensor 300 may utilize a relatively high amount of processing power. In Stage B, the camera image sensor 300 is reconfigured to generate one or more of the low-resolution frames 310 at a high frame rate or capture frequency. As a result, during Stage B, the camera image sensor 300 can capture flickers associated with the flashing lights 192. During Stage C, the camera image sensor 300 is reconfigured back to generating full resolution frames 350. And during Stage D, the camera image sensor 300 is reconfigured back to generate one or more of the low-resolution frames 310 at a high frequency.

Thus, the camera image sensor 300 can be reconfigured to capture low-resolution images 310 when instructed (e.g., via the command 170) to capture flickers associated with the flashing lights 192.

Figure 3C:
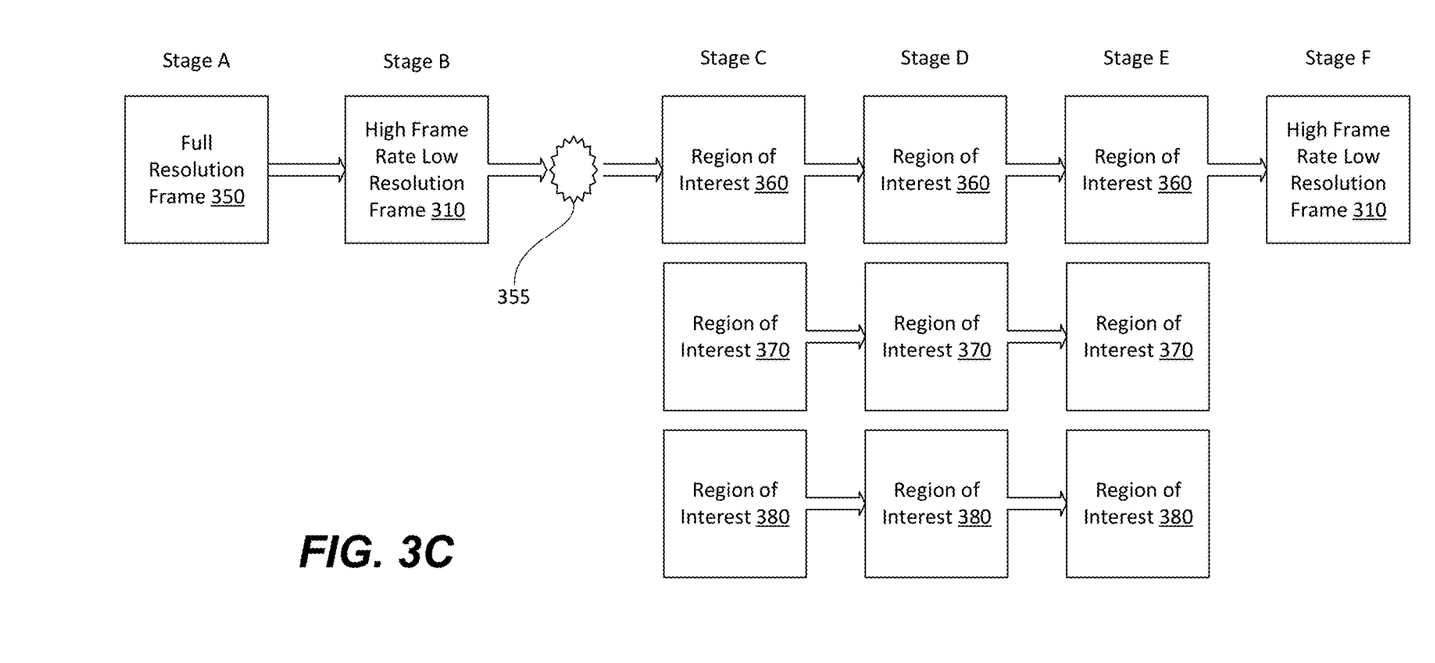
FIG. 3C is a diagram illustrating another sequence of different configurations of the camera image sensor, in accordance with an example embodiment.

FIG. 3C is a diagram illustrating another sequence of different configurations of the camera image sensor 300, in accordance with an example embodiment.

According to FIG. 3B, in Stage A, the camera image sensor 300 generates a full resolution frame 350. To generate the full resolution frame 350, the camera image sensor 300 may utilize a relatively high amount of processing power. In Stage B, the camera image sensor 300 is reconfigured to generate one or more of the low-resolution frames 310 at a high frame rate or capture frequency.

At 355, the camera image sensor 300, the processor 112, or both, can identify flickers of the flashing lights 192 in the low-resolution frames 310 generated during Stage B. In response to identifying the flickers of the flashing lights 192, the camera image sensor 300, the processor 112, or both, can identify regions of interest 360, 370, 380 in the surrounding environment of the autonomous vehicle 100 that are associated with the flickers. During Stage C, Stage D, and Stage E, the camera image sensor 300 can generate additional low-resolution frames 310 (at a high frame rate) with a focus on the regions of interest 360, 370, 380. By focusing on the regions of interest 360, 370, 380, corresponding windows in the resulting low-resolution frames 310 that depict the flickers of the flashing lights (e.g., the window 324) can have enhanced quality while other windows that are not associated with the regions of interest 360, 370, 380 can experience a reduction in quality or clarity. Thus, by focusing on the regions of interest 360, 370, 380, particular portions of the low-resolution frames 310 can be enhanced while maintaining low processing power and reduced image size. During Stage C, the camera image sensor 300 is reconfigured back to generate full resolution frames 350.

Referring back to FIG. 1, in some implementations, the microphone unit 400 can also be used to localize the source 190 of the flashing lights 192. For example, microphones within the microphone unit 400 can capture sounds associated with the source 190 and generate audio frames 452 based on the captured sounds. The audio frames 452 can indicate a time that each microphone within the microphone array captured the sounds. Based on the capture time, the processor 112 can localize the source 190.

Figure 4:
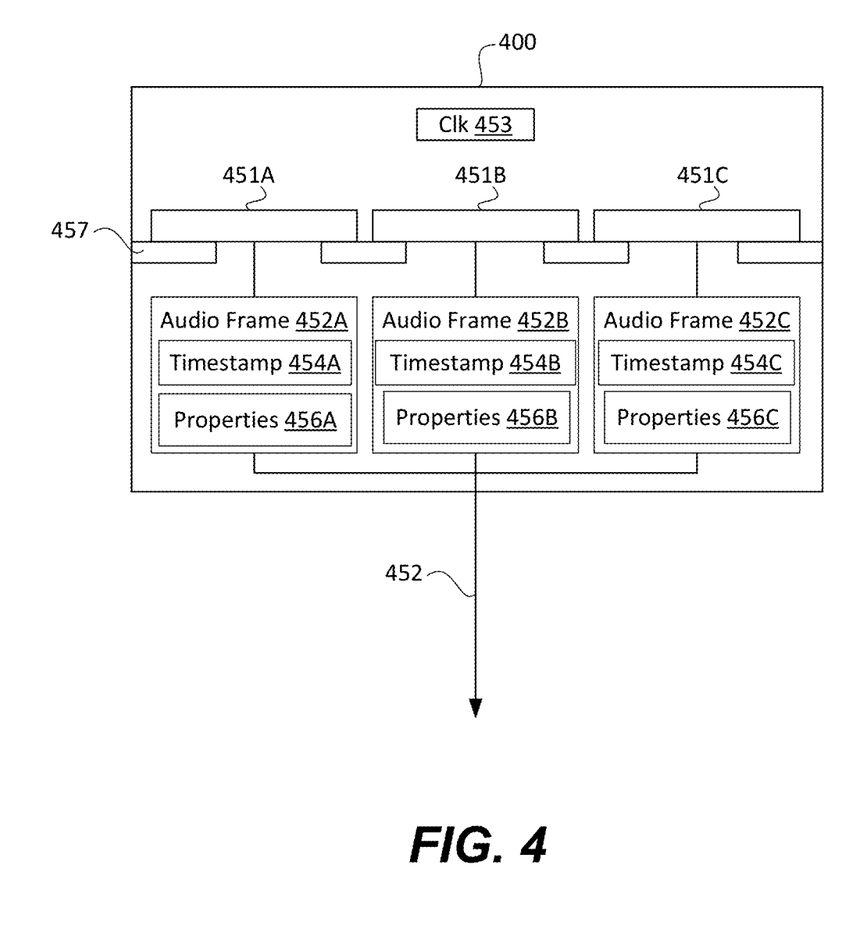
FIG. 4 is an illustrative diagram of a microphone unit, in accordance with an example embodiment.

FIG. 4 is an illustrative diagram of the microphone unit 400, in accordance with an example embodiment. The microphone unit 400 includes a microphone array 451 and an internal clock (Clk) 453. The microphone array 451 includes a microphone 451A, a microphone 451B, and a microphone 451C. Each microphone 451A-451C is coupled to a microphone board 457 and positioned over an opening in the microphone board 457.

The microphones 451A-451C can be oriented in different directions for improved sound source localization. For example, the microphone 451A can be oriented in a first direction, the microphone 451B can oriented in a second direction that is 120 degrees from the first direction, and the microphone 451C can be oriented in a third direction that is 120 degrees from the first direction and 120 degrees from the second direction. To illustrate, the microphone 451A can be oriented towards 0 degrees, the microphone 451B can be oriented towards 120 degrees, and the microphone 451C can be oriented towards 240 degrees.

It should be understood that although three microphones 451A-451C are illustrated, in some implementations, the microphone unit 400 can include additional (or fewer) microphones. As a non-limiting example, the microphone unit 400 can include two microphones. Thus, it should be appreciated that the example illustrated in FIG. 4 is for illustrative purposes only and should not be construed as limiting.

At least one microphone 451A-451C in the microphone array 451 is configured to capture a sound associated with the source 190 to generate a corresponding audio frame 452. For example, the microphone 451A is configured to capture the sound to generate the audio frame 452A. The audio frame 452A can include a timestamp 454A and audio properties 456A of the sound. For example, the microphone unit 400 can generate the timestamp 454A using the internal clock 453. The timestamp 454A is indicative of a time that the microphone 451A captured the sound. The audio properties 456A can correspond to at least one of the frequency characteristics of the sound as captured by the microphone 451A, pitch characteristics of the sound as captured by the microphone 451A, reverberation characteristics of the sound as captured by the microphone 451A, etc. The microphone unit 450 is configured to send the audio frame 452A to the computing system 110. It should be understood that upon detection of the sound, in a similar manner as the microphone 451A, the microphones 451B, 451C can capture the sound and generate audio frames 452B, 452C with corresponding timestamps 454B, 454C and corresponding audio properties 456B, 456C.

Referring back to FIG. 1, the processor 112 is configured to receive the audio frames 452 from the microphone unit 400. Upon reception of the audio frames 452, the sound classification module 124 is configured to determine (or classify) the source 190 of the sound. For example, the sound classification module 124 can determine whether the source 190 is an emergency vehicle, a pedestrian, an ice cream truck, another motor vehicle, etc.

For ease of explanation, the sound classification module 124 is described below as determining whether the source 190 of the sound is an emergency vehicle. As non-limiting examples, the sound classification module 124 is described as determining whether the source 190 is a police car siren, an ambulance siren, a fire truck siren, etc. Although the description is directed to determining whether the source 190 is an emergency vehicle, it should be appreciated that the classification techniques described herein can be implemented to classify the source 190 in scenarios where the source 190 is not an emergency vehicle. As a non-limiting example, the sound classification module 124 could determine whether the source 190 is a train, which, if true, may necessitate stopping the autonomous vehicle 100. As another non-limiting example, the sound classification module 124 could determine whether the source 190 is a child, which, if true, may also necessitate stopping the autonomous vehicle 100. Nevertheless, for ease of description, the following examples are directed towards determining whether the source 190 is an emergency vehicle.

To determine whether the source 190 is an emergency vehicle, the sound classification module 124 can compare the audio properties 456 of the audio frames 452 to a plurality of sound models associated with emergency vehicle sounds. To illustrate, sound model data 134 is stored in the memory 114 and is accessible to the processor 112. The sound model data 134 can include a sound model dataset for different emergency vehicle sounds. As non-limiting examples, the sound model data 134 can include a sound model dataset for police car sirens, a sound model dataset for ambulance sirens, a sound model dataset for fire truck sirens, etc. The sound model data 134 can be updated using machine learning or by a remote transfer of sound model datasets (e.g., from a manufacturer).

The sound classification module 124 can compare the audio properties 456 of the audio frame 452 to each sound model dataset to determine a similarity score. The similarity score can be based on at least one of (i) similarities between the frequency characteristics indicated in the audio properties 456 and frequency characteristics of a selected sound model dataset, (ii) similarities between the pitch characteristics indicated in the audio properties 456 and pitch characteristics of the selected sound model dataset, (iii) similarities between the reverberation characteristics indicated in the audio properties 456 and reverberation characteristics of the selected sound model dataset, etc. If the similarity score for the selected sound model dataset is above a particular threshold, the sound classification module 124 can determine that the source 190 is a corresponding emergency vehicle.

The location determination module 120 is configured to determine a location of the source 190 relative to the autonomous vehicle 100 based on the timestamps 454. For example, because the microphones 451A-451C are oriented in different directions, the microphones 451A-451C capture the sound at slightly different times such that the times indicated by the timestamps 454A-454C are slightly different. To localize the source 190 relative to the autonomous vehicle 100, the processor 112 is configured to correlate each audio frame 452A-452C as capturing the same sound from the source 190 by comparing the audio properties 456A-456C. Upon correlating each audio frame 452A-452C, the processor 112 is configured to compare the timestamps 454A-454C of each audio frame 452A-452C to determine a particular microphone 451 that first captured the sound 190.

For the purposes of description, assume that the timestamp 454A indicates an earlier time than the timestamps 454B, 454C. Based on this assumption, the processor 112 is configured to localize the source 190 relative to the autonomous vehicle 100 based on orientation of the microphone 451A. In a similar manner as described with respect to FIGS. 3A-3B, the camera image sensor 300 can further localize the source 190 after the general location is determined using the timestamps 454 of the audio frames 452.

The command generation module 128 is configured to generate a command 150 to maneuver the autonomous vehicle 100 based on the location of the source 190. As a non-limiting example, if the location determination module 126 indicates that the location of the source 190 is to the front-left side of the autonomous vehicle 100, the command generation module 128 can generate a command 150 to navigate the autonomous vehicle 100 to the right side of the road. Additionally, or in the alternative, the command generation module 128 can generate a command 150 to reduce the speed of the autonomous vehicle 100.

The command generation module 122 can send the command 150 to the autonomous vehicle control unit 106. The autonomous vehicle control unit 106 can be coupled to control different components of the autonomous vehicle 100, such as the steering wheel, the brakes, the accelerator, the turn signals, etc. Based on the command 150, the autonomous vehicle control unit 106 can send signals to the different components of the autonomous vehicle 100. For example, the autonomous vehicle control unit 106 can send a signal to enable the steering wheel to maneuver the autonomous vehicle 100 to the side of the road, the autonomous vehicle control unit 106 can send a signal to enable the brakes to reduce the speed (or stop) the autonomous vehicle 100, etc.

According to one implementation, the command generation module 128 can generate a command 150 to change a mode of the autonomous vehicle 100 into a user assist mode in response to determining the location of the source 190. In this implementation, in response to receiving the command 150, the autonomous vehicle control unit 106 can send signals to components of the autonomous vehicle 100 to disable an autonomous mode of operation so that a driver can control operation of the autonomous vehicle 100.

The techniques described with respect to FIGS. 1-4 enable the autonomous vehicle 100 to localize the source 190 (e.g., an emergency vehicle) in scenarios where localization is otherwise compromised due to noise. For example, if the microphones cannot detect a siren associated with the source 190 because of background noise or if the source 190 does not have a siren, the array of photodiodes 200, the camera image sensor 300, or both, can be used to localize the source 190 based on the detection of the flashing lights 192. In some scenarios, the array of photodiodes 200, the microphone unit 400, or both, can be used to determine a general location of the source 190. Based on the general location, the camera image sensor 300 can be used to further localize the source 190. It should also be appreciated that by using the array of photodiodes 200 and the camera image sensor 300 to detect the flashing lights 192, source localization based on optical sensors can be performed using a reduced amount of processing power and data as compared to the amount of processing power and data used to process high-resolution images. The optical sensors described herein can also have multiple spectral channels that are calibrated to detect illumination.

Additionally, the techniques described above may be used to detect a pulse width modulated (PWM) light. As a non-limiting example, a red light may be PWM at 120 Hz. A typical camera operating a relatively low framerate (e.g., 10 Hz) may only sample the red light during dark parts of the PWM cycle if the exposure time of the camera is relatively short (e.g., less than eight milliseconds). As a result, the typical camera may not be able to capture the red light. However, according to the techniques described above, the high frequency of the PWM light can be detected using the array of photodiodes 200 and the resulting waveforms.

Figure 5:
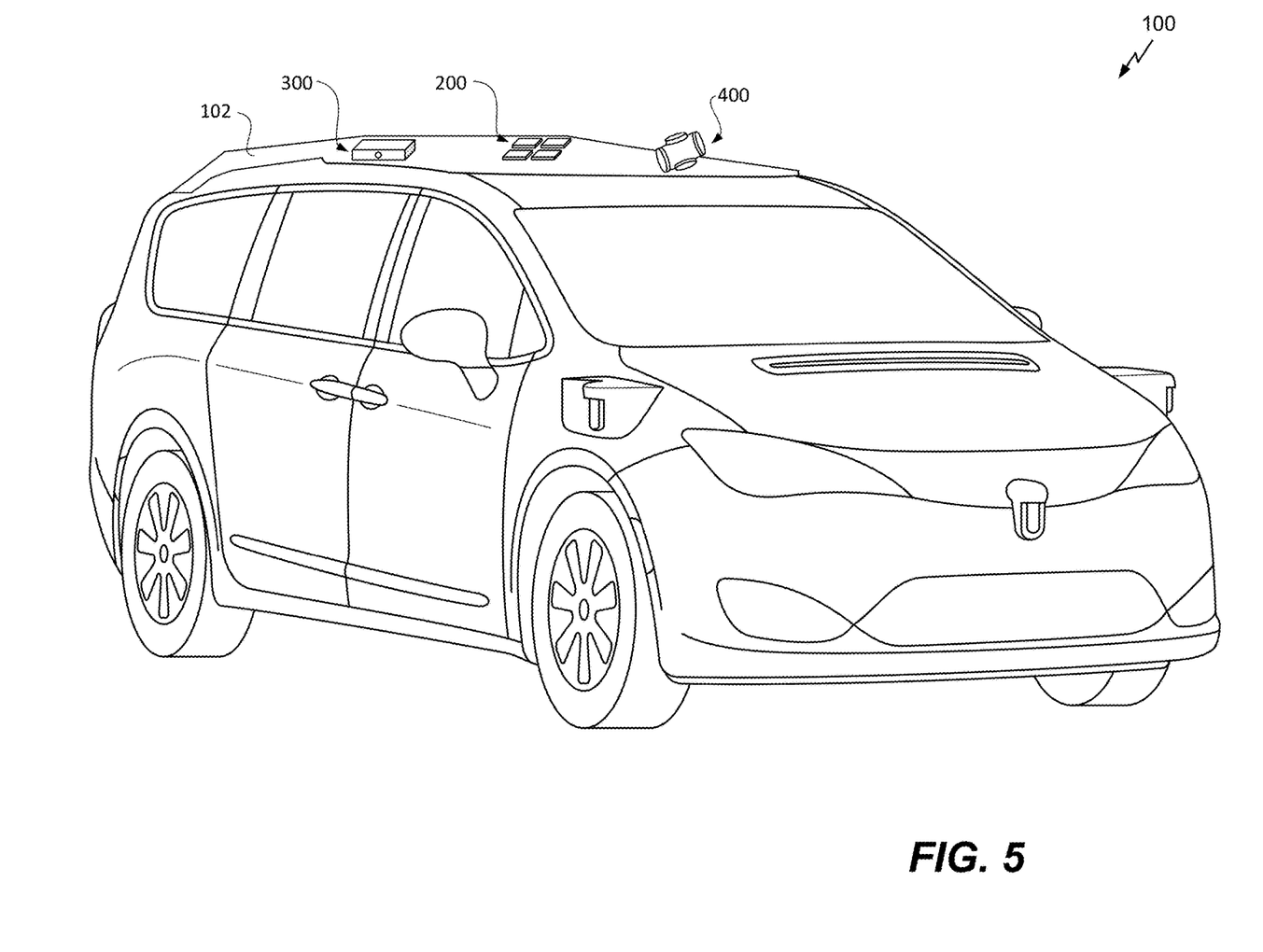
FIG. 5 depicts a diagram of an autonomous vehicle having different sensors coupled to a roof, in accordance with example embodiments.

FIG. 5 depicts a diagram of the autonomous vehicle 100 having different sensors coupled to a roof 102, according to example embodiments. For example, in FIG. 5, the array of photodiode sensors 200, the camera image sensor 300, and the microphone unit 400 are coupled to the roof 102 of the autonomous vehicle 100. It should be understood that the number of sensors 200, 300, 400 and the types of sensors 200, 300, 400 coupled to the roof 102 are merely for illustrative purposes and should not be construed as limiting. For example, in other implementations, additional (or fewer) arrays of photodiode sensors 200 can be coupled to roof 102, additional (or fewer) camera image sensors 300 can be coupled to the roof 102, and additional (or fewer) microphone units 400 can be coupled to the roof 102. Additionally, in some implementations, a subset of sensors 200, 300, 400 can be coupled to the roof 102.

III. Example Methods

Figure 6:
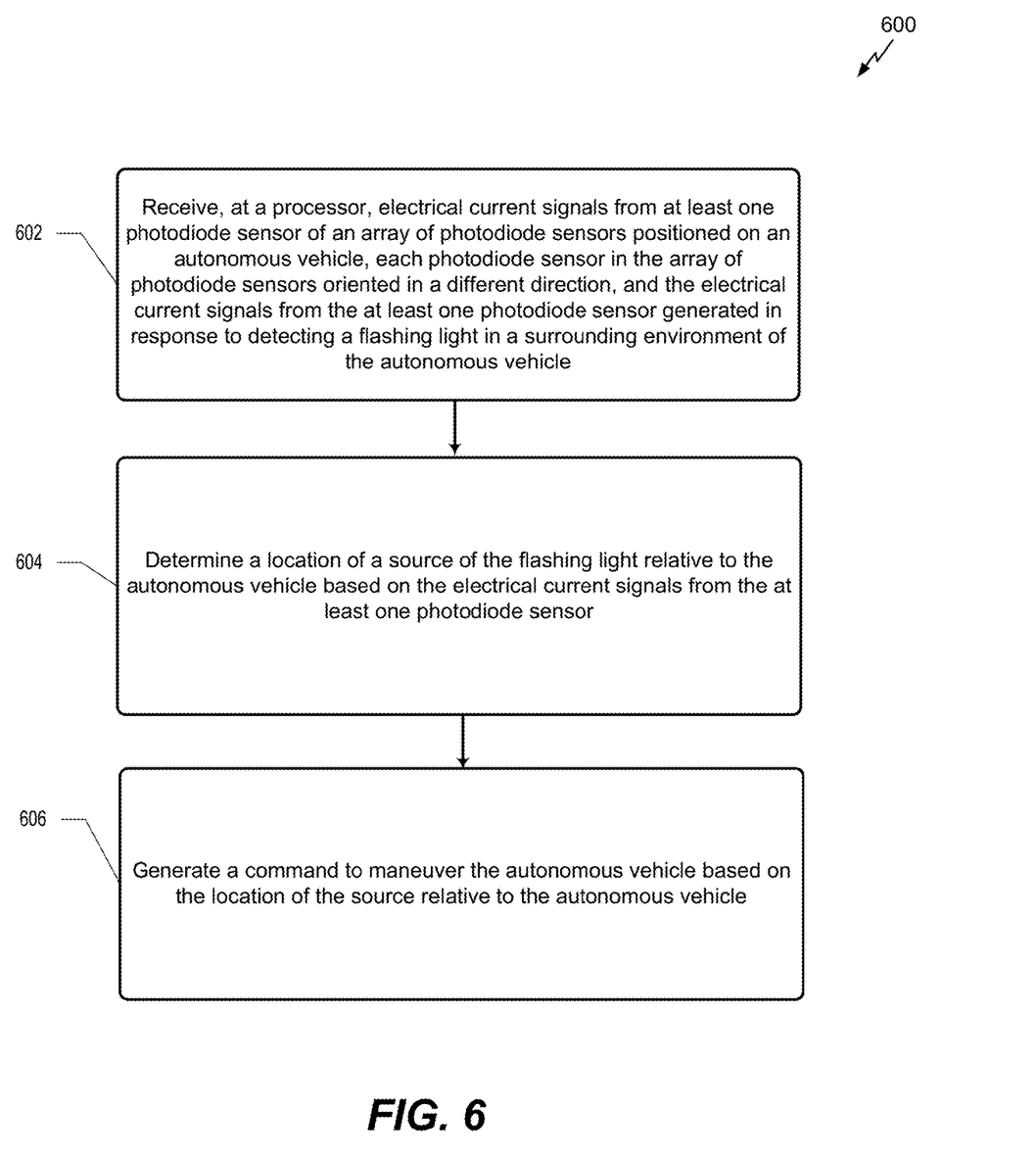
FIG. 6 is a flowchart of a method, according to an example embodiment.

FIG. 6 is a flowchart of a method 600, according to an example embodiment. The method 600 can be performed by the autonomous vehicle 100, the array of photodiode sensors 200, the camera image sensor 300, the microphone unit 400, or a combination thereof.

The method 600 includes receiving, at a processor, electrical current signals from at least one photodiode sensor of an array of photodiode sensors positioned on an autonomous vehicle, at 602. Each photodiode sensor in the array of photodiode sensors is oriented in a different direction, and the electrical current signals from the at least one photodiode sensor are generated in response to detecting a flashing light in a surrounding environment of the autonomous vehicle. For example, referring to FIGS. 1 and 2A, the photodiode sensors 200 are positioned on the roof 102 of the autonomous vehicle 100 and generate electrical current signals 210 in response to detecting flickers associated with the flashing light 192. Each photodiode sensor 200A-200D can be oriented in a different direction. The electrical current signals 210 are provided to the processor 112.

The method 600 also includes determining a location of a source of the flashing light relative to the autonomous vehicle based on the electrical current signals from the at least one photodiode sensor, at 604. For example, referring to FIG. 1, the location determination module 126 can determine the location of the source 190 of the flashing lights 192 relative to the autonomous vehicle 100 based on the electrical current signals 210 from the photodiode sensors 200. To determine the location of the source 190 relative to the autonomous vehicle 100, the processor 112 can (i) determine a first magnitude of first electrical current signals 210A from the first photodiode sensor 200A oriented in the first direction, (ii) determine a second current magnitude of second electrical current signals 210B from the second photodiode sensor 200B oriented in the second direction, and (iii) perform a localization operation to localize the source 190 relative to the autonomous vehicle 100 based on the first current magnitude and the second current magnitude. For example, a result of the localization operation may indicate the source 190 is proximate to the first direction in response to a determination that the first current magnitude is greater than the second current magnitude. Alternatively, a result of the localization operation may indicate the source 190 is proximate to the second direction in response to a determination that the second current magnitude is greater than the first current magnitude.

According to one implementation, the method 600 also includes determining, based at least on characteristics of the electrical current signals from the array of photodiode sensors, a frequency of the flashing light. For example, the electrical current signals 210A-210D generated by the photodiode sensors 200A-200D can be AC waveforms, and the flicker frequency of the flashing lights 192 can be determined based on the cycle time of the AC waveforms. The method 600 can also include classifying the source based on the frequency. For example, upon determining the flicker frequency of the flashing lights 192, the frequency domain classification module 120 can access flicker frequency model data 132 in the memory 114 to classify the source 190 of the flashing lights 192. The flicker frequency model data 132 indicates flicker frequencies for different sources. As a non-limiting example, the flicker frequency model data 132 can indicate that emergency vehicles have a flicker frequency between 10 Hz and 20 Hz. Thus, if the frequency of the electrical current signal 210 is between 10 Hz and 20 Hz, the frequency domain classification module 120 can classify the source 190 of the flashing lights 192 as an emergency vehicle.

According to one implementation, the method 600 also includes determining a flash frequency for an emergency vehicle and sending a reconfiguration command 170 to reconfigure the camera image sensor 300 to capture low-resolution images 310 at a frequency that is at least twice the flash frequency for the emergency vehicle. The method 600 can also include receiving low-resolution images of the surrounding environment captured by a camera image sensor. For example, the processor 112 can receive the low-resolution images 310 from the camera image sensor 300. The location of the source 190 relative to the autonomous vehicle 100 can further be determined based on the low-resolution images 310. For example, to further determine or localize the location of the source 190, the method 600 can include identifying, across a subset of the low-resolution images 310, the window 324 that depicts the flashing lights 192 and determining the location of the source 190 based on the identified window 324.

The method 600 also includes generating a command to maneuver the autonomous vehicle based on the location of the source relative to the autonomous vehicle, at 606. For example, referring to FIG. 1, the command generation module 128 generates the command 150 to maneuver the autonomous vehicle 100 based on the location of the source 190 relative to the autonomous vehicle 100. The command generation module 122 can send the command 150 to the autonomous vehicle control unit 106. The autonomous vehicle control unit 106 can be coupled to control different components of the autonomous vehicle 100, such as the steering wheel, the brakes, the accelerator, the turn signals, etc. Based on the command 150, the autonomous vehicle control unit 106 can send signals to the different components of the autonomous vehicle 100. For example, the autonomous vehicle control unit 106 can send a signal to enable the steering wheel to maneuver the autonomous vehicle 100 to the side of the road, the autonomous vehicle control unit 106 can send a signal to enable the brakes to reduce the speed (or stop) the autonomous vehicle 100, etc.

According to one implementation, the command generation module 128 can generate a command 150 to change a mode of the autonomous vehicle 100 into a user assist mode in response to determining the location of the source 190. In this implementation, in response to receiving the command 150, the autonomous vehicle control unit 106 can send signals to components of the autonomous vehicle 100 to disable an autonomous mode of operation so that a driver can control operation of the autonomous vehicle 100.

The method 600 of FIG. 6 enables the autonomous vehicle 100 to localize the source 190 (e.g., an emergency vehicle) in scenarios where localization is otherwise compromised due to noise. For example, if the microphones cannot detect a siren associated with the source 190 because of background noise or if the source 190 does not have a siren, the array of photodiodes 200, the camera image sensor 300, or both, can be used to localize the source 190 based on the detection of the flashing lights 192. In some scenarios, the array of photodiodes 200, the microphone unit 400, or both, can be used to determine a general location of the source 190. Based on the general location, the camera image sensor 300 can be used to further localize the source 190. It should also be appreciated that by using the array of photodiodes 200 and the camera image sensor 300 to detect the flashing lights 192, source localization based on optical sensors can be performed using a reduced amount of processing power and data as compared to the amount of processing power and data used to process high-resolution images. The optical sensors described herein can also have multiple spectral channels that are calibrated to detect illumination.

IV. Conclusion

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. A system comprising:
an array of photodiode sensors positioned on an autonomous vehicle, each photodiode sensor in the array of photo diode sensors oriented in a different direction with respect to at least one other photodiode sensor and configured to generate electrical current signals in response to detecting a flashing light in a surrounding environment of the autonomous vehicle;
an image sensor configured to capture high-resolution and reduced-resolution images of the surrounding environment of the autonomous vehicle at a first frequency wherein the reduced-resolution images comprise lower resolution than the high-resolution images; and
a processor coupled to the array of the photodiode sensors, the processor configured to:
determine a general location of a source of the flashing light relative to the autonomous vehicle based on the electrical current signals from at least one photodiode sensor in the array of photodiode sensors;
determine a flash frequency of the flashing light;
send a reconfiguration command to cause the image sensor to capture the reduced-resolution images at a second frequency that is at least twice the flash frequency; and
determine a further localized location of the source of the flashing light relative to the autonomous vehicle based on the reduced-resolution images from the image sensor, or a combination of the reduced-resolution images from the image sensor and the electrical current signals from at least one photodiode sensor in the array of photodiode sensors; and
generate a command to maneuver the autonomous vehicle based on the further localized location of the source relative to the autonomous vehicle.

2. The system of claim 1, wherein the processor is further configured to determine, based at least on characteristics of the electrical current signals from the array of photodiode sensors, a frequency of the flashing light; and
classify the source based on the frequency.

3. The system of claim 2, wherein the processor is configured to classify the source as an emergency vehicle in response to a determination that the frequency of the flashing light is between 10 Hertz and 20 Hertz.

4. The system of claim 1, wherein, to determine the location of the source relative to the autonomous vehicle, the processor is configured to:
determine a first current magnitude of first electrical current signals from a first photodiode sensor oriented in a first direction;
determine a second current magnitude of second electrical current signals from a second photodiode sensor oriented in a second direction; and
perform a localization operation to localize the source relative to the autonomous vehicle based on the first current magnitude and the second current magnitude.

5. The system of claim 4, wherein the result of the localization operation indicates the source is proximate to the first direction in response to a determination that the first current magnitude is greater than the second current magnitude.

6. The system of claim 4, wherein a result of the localization operation indicates the source is proximate to the second direction in response to a determination that the second current magnitude is greater than the first current magnitude.

7. The system of claim 1, wherein, to determine the location of the source relative to the autonomous vehicle based on the reduced-resolution images, the processor is configured to:
identify, across a subset of the reduced-resolution images, a window that depicts the flashing light; and
determine the location of the source based on the identified window.

8. The system of claim 1, further comprising a Fresnel lens coupled to the array of photodiode sensors.

9. The system of claim 1, wherein the array of photodiode sensors is coupled to a roof of the autonomous vehicle.

10. The system of claim 1, further comprising:
a microphone array comprising a plurality of microphones positioned on the autonomous vehicle, each microphone of the microphone array oriented in a different direction with respect to at least one other microphone and configured to capture a particular sound from the source to generate a corresponding audio frame having a timestamp based on an internal clock associated with the microphone array, the timestamp indicative of a time a corresponding microphone of the microphone array captured the particular sound,
wherein the processor is further configured to determine the location of the source relative to the autonomous vehicle based on the timestamps of the audio frames.

11. The system of claim 1, wherein the command to maneuver the autonomous vehicle comprises a command to reduce the speed of the autonomous vehicle.

12. The system of claim 1, wherein the command to maneuver the autonomous vehicle comprises a command to navigate the autonomous vehicle to a side of a road.

13. The system of claim 1, wherein the command to maneuver the autonomous vehicle comprises a command to change a mode of the autonomous vehicle into a user assist mode.

14. The system of claim 2, wherein the processor is further configured to compare the frequency of the flashing light to a flicker frequency model data, wherein classifying the source is further based on the comparison of the frequency of the flashing light to the flicker frequency model data.

15. A method comprising:
receiving, at a processor, electrical current signals from at least one photodiode sensor of an array of photodiode sensors positioned on an autonomous vehicle, each photodiode sensor in the array of photodiode sensors oriented in a different direction with respect to at least one other photodiode sensor, and the electrical current signals from the at least one photodiode sensor generated in response to detecting a flashing light in a surrounding environment of the autonomous vehicle;
receiving, by an image sensor configured to capture high-resolution and reduced-resolution images at a first frequency, reduced-resolution images of the surrounding environment, wherein the reduced-resolution images comprise lower resolution than the high-resolution image;
determining a general location of a source of the flashing light relative to the autonomous vehicle based on the electrical current signals from at least one photodiode sensor in the array of photodiode sensors;
determining a flash frequency of the flashing light
sending a reconfiguration command to cause the image sensor to capture the reduced-resolution images at a second frequency that is at least twice the flash frequency;
determining a further localized location of the source of the flashing light relative to the autonomous vehicle based on the reduced-resolution images from the image sensor, or a combination of the reduced-resolution images from the image sensor and the electrical current signals from at least one photodiode sensor in the array of photodiode sensors; and
generating a command to maneuver the autonomous vehicle based on the location of the source relative to the autonomous vehicle.

16. The method of claim 15, further comprising:
determining, based at least on characteristics of the electrical current signals from the at least one photodiode sensor, a frequency of the flashing light; and
classifying the source based on the frequency.

17. The method of claim 15, further comprising:
receiving high-resolution and reduced-resolution images of the surrounding environment captured by an image sensor, wherein the reduced-resolution images comprise lower resolution than the high-resolution images, wherein the location of the source relative to the autonomous vehicle is further determined based on the reduced-resolution images.

18. The method of claim 17, wherein determining the location of the source relative to the autonomous vehicle based on the reduced-resolution images comprises:
identifying, across a subset of the reduced-resolution images, a window that depicts the flashing light; and
determining the location of the source based on the identified window.

19. The method of claim 16, further comprising:
comparing the frequency of the flashing light to a flicker frequency model data, wherein classifying the source is further based on the comparison of the frequency of the flashing light to the flicker frequency model data.

20. A non-transitory computer-readable medium having stored therein instructions executable by a computing device to cause the computing device to perform functions, the functions comprising:
receiving, at a processor, electrical current signals from at least one photodiode sensor of an array of photodiode sensors positioned on an autonomous vehicle, each photodiode sensor in the array of photodiode sensors oriented in a different direction with respect at least one other photodiode sensor, and the electrical current signals from the at least one photodiode sensor generated in response to detecting a flashing light in a surrounding environment of the autonomous vehicle;
receiving, by an image sensor configured to capture high-resolution and reduced resolution images of the surrounding environment of the autonomous vehicle at a first frequency wherein the reduced-resolution images comprises lower resolution than the high-resolution images;
determining a general location of a source of the flashing light relative to the autonomous vehicle based on the electrical current signals from at least one photodiode sensor in the array of photodiode sensors;
determining a flash frequency of the flashing light
sending a reconfiguration command to cause the image sensor to capture the reduced-resolution images at a second frequency that is at least twice the flash frequency;
and
determining a location of a source of the flashing light relative to the autonomous vehicle based at least on the electrical current signals from the at least one photodiode sensor in the array of photodiode sensors, the reduced-resolution images form the camera image sensor, or a combination thereof; and
generating a command to maneuver the autonomous vehicle based on the location of the source relative to the autonomous vehicle.

21. The non-transitory computer-readable medium of claim 20, wherein the functions further comprise:
determining, based at least on characteristics of the electrical current signals from the array of photodiode sensors, a frequency of the flashing flight;
classifying the source based on the frequency; and
comparing the frequency of the flashing flight to a flicker frequency model data, wherein classifying the source is further based on the comparison of the frequency of the flashing light to the flicker frequency model data.

* * * * *